United States Patent
Tornare et al.

(10) Patent No.: US 10,215,790 B2
(45) Date of Patent: Feb. 26, 2019

(54) METHOD FOR DIAGNOSING AN EARTH FAULT OF A START/STOP UNIT OF A MOTOR VEHICLE

(71) Applicants: CONTINENTAL AUTOMOTIVE FRANCE, Toulouse (FR);
CONTINENTAL AUTOMOTIVE GMBH, Hannover (DE)

(72) Inventors: Jean-Marc Tornare, Colomiers (FR); Christophe Pradelles, Fiac (FR)

(73) Assignees: CONTINENTAL AUTOMOTIVE FRANCE, Toulouse (FR);
CONTINENTAL AUTOMOTIVE GMBH, Hannover (DE)

( * ) Notice: Subject to any disclaimer, the term of this patent is extended or adjusted under 35 U.S.C. 154(b) by 13 days.

(21) Appl. No.: 15/524,275

(22) PCT Filed: Oct. 28, 2015

(86) PCT No.: PCT/EP2015/002140
§ 371 (c)(1),
(2) Date: May 4, 2017

(87) PCT Pub. No.: WO2016/070973
PCT Pub. Date: May 12, 2016

(65) Prior Publication Data
US 2017/0322250 A1 Nov. 9, 2017

(30) Foreign Application Priority Data

Nov. 4, 2014 (FR) ..................................... 14 60614

(51) Int. Cl.
*G01R 31/00* (2006.01)
*B60L 3/00* (2006.01)
(Continued)

(52) U.S. Cl.
CPC .......... *G01R 31/025* (2013.01); *B60L 3/0069* (2013.01); *G01R 31/006* (2013.01); *G07C 5/0808* (2013.01)

(58) Field of Classification Search
CPC ........ G07C 5/00; G07C 5/0808; G01R 31/00; G01R 31/025; G01R 31/006; B60L 3/00; B60L 3/0069
See application file for complete search history.

(56) References Cited

U.S. PATENT DOCUMENTS 9,678,134 B2 * 6/2017 Yamashita ............. G01R 31/04
9,846,190 B2 * 12/2017 Tateda ................. G01R 31/025
(Continued)

FOREIGN PATENT DOCUMENTS

JP   2013/061215 A   4/2013
JP   2013/130536 A   7/2013

OTHER PUBLICATIONS

International Search Report, dated Feb. 1, 2016, from corresponding PCT application.

*Primary Examiner* — Yonel Beaulieu
(74) *Attorney, Agent, or Firm* — Young & Thompson

(57) ABSTRACT

A method for diagnosing a ground fault of a start/stop unit of a motor vehicle and a start/stop system implementing the method. The method comprises, in a preliminary phase, providing a driver device with a ground that can be switched between two positions and connecting a ground output of a start/stop device to the switchable ground. When the vehicle is in operation, at the time of a start/stop instruction: reading a first value of the signal at the input of the reading circuit, then temporarily switching the switchable ground from a first position connected to a ground of the vehicle to a second position connected to a ground resistor; reading a second value of the signal received by the reading circuit when the ground is switched to the ground resistor, and
(Continued)

comparing the two read values in order to diagnose a short-circuit to ground fault of the start/stop unit.

12 Claims, 2 Drawing Sheets

(51) Int. Cl.
*G07C 5/00* (2006.01)
*G01R 31/02* (2006.01)
*G07C 5/08* (2006.01)

(56) References Cited

U.S. PATENT DOCUMENTS

| | | | |
|---|---|---|---|
| 9,911,249 B2 * | 3/2018 | Koch | G07C 5/0808 |
| 10,001,519 B2 * | 6/2018 | Choe | G01R 31/025 |
| 2009/0195205 A1 | 8/2009 | Ide | |
| 2012/0025844 A1 | 2/2012 | Morita | |

* cited by examiner

METHOD FOR DIAGNOSING AN EARTH FAULT OF A START/STOP UNIT OF A MOTOR VEHICLE

BACKGROUND OF THE INVENTION

The present invention concerns a method of diagnosing a start/stop unit of a motor vehicle motor. It relates more particularly to determining if said start/stop unit is short-circuited to ground.

In known manner, start/stop units (usually termed start/stop buttons) are used in motor vehicles to transmit to a computer controlling the motor an instruction to start or stop said motor.

Such units are notably employed in vehicles equipped with a hands-free access system that does not use a mechanical key. They are routinely fitted to vehicles incorporating a function for stopping the motor when the vehicle is immobile and automatically restarting as soon as the vehicle begins to move again (for example after the accelerator pedal or the clutch pedal is depressed). These so-called stop and go functions are well known in themselves and will not be described in detail here.

Start/stop systems 100 (see FIG. 1) consist of a start/stop device 10 controlled by a driver device 11. The start/stop device 10 conventionally includes three inputs outputs. Namely:
  a power supply input 1,
  a control output 2 delivering a control signal for starting and stopping a motor (not shown), and
  a ground output 3.

Said start/stop device 10 also includes a two-position start/stop unit (switch 4) connected by a conductive track 5 to the control output 2. The power supply input 1 of the start/stop device 10 also includes in known manner a light-emitting diode (LED 14) in series with a power supply resistor $R_4$. This LED 14 has the function of lighting up to render the start/stop unit 4 visible.

FIG. 1 also shows a conventional circuit diagram of a driver device 11 including a computer 12, a control circuit 13 connected to the power supply input 1 of the start/stop device 10, a circuit 15 for reading the status of the start/stop unit and a ground return 16.

When a driver wishes to activate the start/stop unit 4, it suffices for them to depress the switch 4 to switch it to its closed position. When this is done, the input of the reading circuit 15 detects a signal value substantially equal to zero (or very low).

Now, the value read by the reading circuit 15 is also substantially equal to zero (or very low) if a short-circuit ground (shown by two broken lines CC) occurs on the conductive track 5 between the switch 4 and the output 2.

Two distinct states, namely a start/stop instruction and a short-circuit on the conductive track 5, have the same consequence in that the same value (zero) is detected by the reading circuit 15. It is therefore not possible to distinguish these two states from each other, which constitutes a serious risk of misinterpretation of the instruction given by the driver.

In fact, if a short-circuit to ground occurs on the conductive track 5, it may generate an (unwanted) instruction to start the motor, which constitutes a risk of malfunction critical for the use of the vehicle.

This risk is generally circumvented by the fact that other parameters exist that make it possible to verify that an instruction to start the motor has been given. For example, the control system of the vehicle will verify that the brake or the clutch pedal has also been activated. It has nevertheless appeared important to eliminate this risk of starting the motor with a short-circuit to ground present on the conductive track 5 in order to make the vehicle safer without calling for specific maneuvers to be performed by the driver (depressing the brake or the clutch pedal).

BRIEF SUMMARY OF THE INVENTION

The object of the present invention is therefore to alleviate all the disadvantages described above and notably to make it possible to detect (to diagnose) a short-circuit to ground in the unit controlling starting/stopping of the motor. Another object of the invention is to enable said diagnosis in a reliable manner and at relatively low cost.

To this end, the present invention concerns a method of diagnosing a ground fault of a start/stop unit adapted to control the starting and the stopping of a vehicle motor, said unit being part of a start/stop device further including a ground output, said device being further associated with a control device including a circuit for reading the status of the start/stop unit, said diagnostic method being characterized in that it consists in:
  in a preliminary phase:
    equipping the control device with a ground switchable between two positions and connecting the ground output of the start/stop device to said switchable ground,
  during operation of the vehicle, at the time of a start/stop instruction:
    reading a first value of the signal present at the input of the reading circuit, then,
    temporarily switching the switchable ground from a first position connected to a ground of the vehicle to a second position connected to a ground resistor,
    reading a second value of the signal received by the reading circuit during the switching of the ground to the resistor,
    comparing the first and second values, and
      if the first and second values read are substantially equal, diagnosing a short-circuit to ground fault,
      if the first and second values read are significantly different, diagnosing an absence of a short-circuit to ground fault of the start/stop unit.

Thus the invention consists in using a switchable ground at the level of the control device. According to the invention, the ground of the start/stop device is connected to this switchable ground. At the time of an instruction to start/stop the vehicle (whether this is real or caused by a short-circuit to ground), the control device temporarily switches said switchable ground to a position connected to a resistor $R_M$. Because of this, when the reading circuit reads the value at its input, it is possible to distinguish the short-circuit to ground of the start/stop unit from a start/stop instruction. In fact, in the absence of a short-circuit, the value read when the switchable ground is in the position connected to the resistor $R_M$ is different from the value read when the switchable ground is simply connected to the ground of the vehicle.

The switching of the ground between two positions, one connected to the ground of the vehicle and the other connected to a resistor $R_M$, therefore makes it possible to be certain of distinguishing a short-circuit to ground of the start/stop unit and an instruction to start/stop the motor of the vehicle.

The values read by the reading circuit are advantageously voltage values.

The present invention also concerns a system for starting/stopping a vehicle motor, including:
- a start/stop device including a unit for starting/stopping the motor of the vehicle and a ground output, and
- a control circuit including:
  - a circuit for reading the status of the start/stop unit, said system being characterized in that the control device further includes:
- a switchable ground including a ground switch connected on the one hand to the ground output of the start/stop device and on the other hand to a ground of the vehicle, said ground switch being adapted to switch between a position connected to the ground of the vehicle and a position connected to a ground resistor.

The switchable ground advantageously consists of a switching unit connected in parallel with the resistor $R_M$.

The switching unit is advantageously controlled by a computer of the control device. The switching unit is preferably a protected electronic transistor.

A voltage divider bridge is preferably created by the resistor $R_M$ and a resistor $R_L$ in the reading circuit and connected to the battery of the vehicle.

BRIEF DESCRIPTION OF THE SEVERAL VIEWS OF THE DRAWINGS

Other objects, advantages and features of the invention will emerge from the following detailed description given by way of nonlimiting example and with reference to the appended drawings, in which.

DETAILED DESCRIPTION OF THE INVENTION

Figure 1:
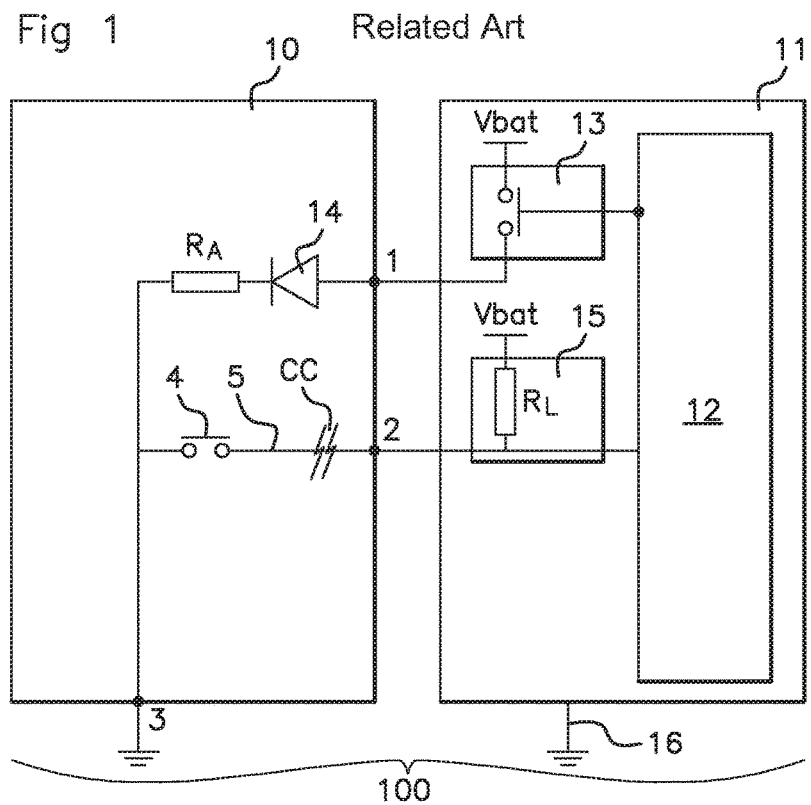
FIG. 1, already described, is a diagram representing a prior art start/stop system.
Figure 2:
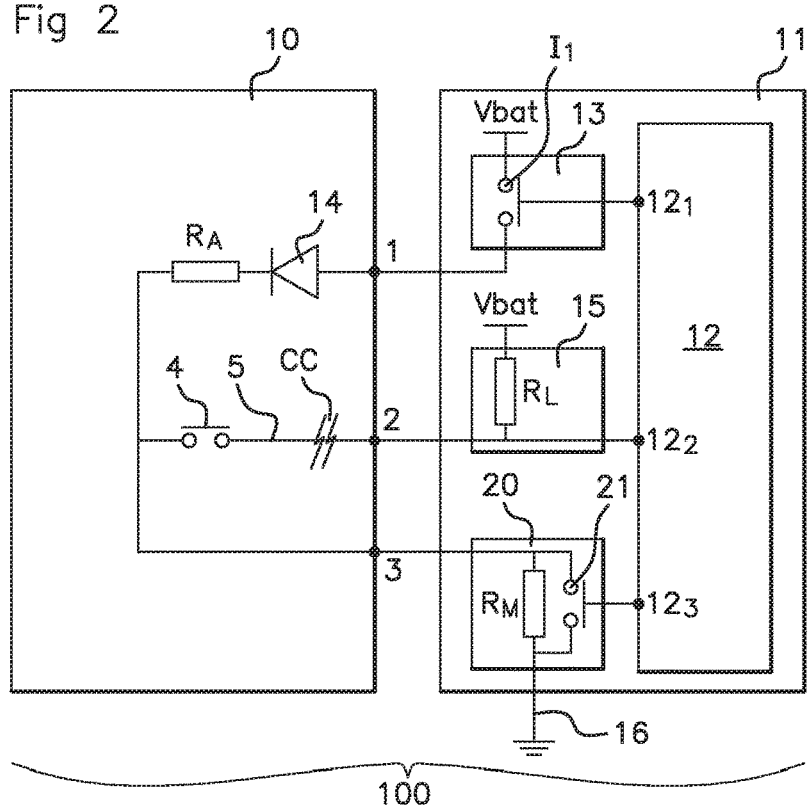
FIG. 2 is a diagram showing a start/stop system according to the invention.

As shown in FIG. 2, the start/stop system 100 according to the invention includes:
- a start/stop device 10 including:
  - a power supply input 1 connected to a light-emitting diode (LED) 14 in series with a power supply resistor $R_A$;
  - a control output 2 connected by a conductive track 5 to a start/stop unit 4 of the motor of a vehicle itself supplied via the power supply resistor $R_A$; this start/stop unit 4 preferably takes the form of a two-position pushbutton switch; and
  - a ground output 3;
- a driver device 11 including:
  - a control circuit 13 connected to the power supply input 1 of the device 10,
  - a reading circuit 15 connected to the control output 2 of the device 10,
  - a switchable ground 20 connected to the ground output of the device 10, and
  - a computer 12 driving the control circuit 13 via a control output $12_1$ and the switchable ground via a control output $12_3$. The computer 12 reads at its reading input $12_2$ the value of the signal (preferably the voltage) coming from the control output 2 of the device 10.

The control circuit 13 of the driver device 11 consists of a control switch $I_1$ connected on the one hand to the battery $V_{bat}$ of the vehicle and on the other hand to the power supply input 1 of the start/stop device 10. This switch $I_1$ is also controlled by the control output $12_1$ of the computer 12. A driver circuit of this kind is referred to as a high side driver circuit because the switch $I_1$ is between the battery and the load to be controlled.

The reading circuit 15 includes a reading resistor $R_L$ supplied with power by the battery $V_{bat}$ of the vehicle and connected to a conductive track 6 connecting the control output 2 of the device 10 and the reading input $12_2$ of the computer 12.

The control and reading circuits are of known type and will not be described in detail here.

The switchable ground 20 according to the invention consists of a ground resistor $R_M$ in parallel with a ground switch 21, this combination being connected to the ground output 3 of the device 10 and to a ground of the vehicle 16. For its part, the ground switch 12 is controlled by the control output $12_3$ of the computer 12. The computer 12 is therefore able to close the ground switch 21 so that the ground output 3 of the device 10 is connected to the ground 16 of the vehicle or to open the switch 21 to connect the ground output 3 of the device 10 to the ground resistor $R_M$.

The ground switch (switching unit) 21 is for example a protected electronic transistor.

A short-circuit to ground CC is represented by two broken lines in FIG. 2.

Figure 3:
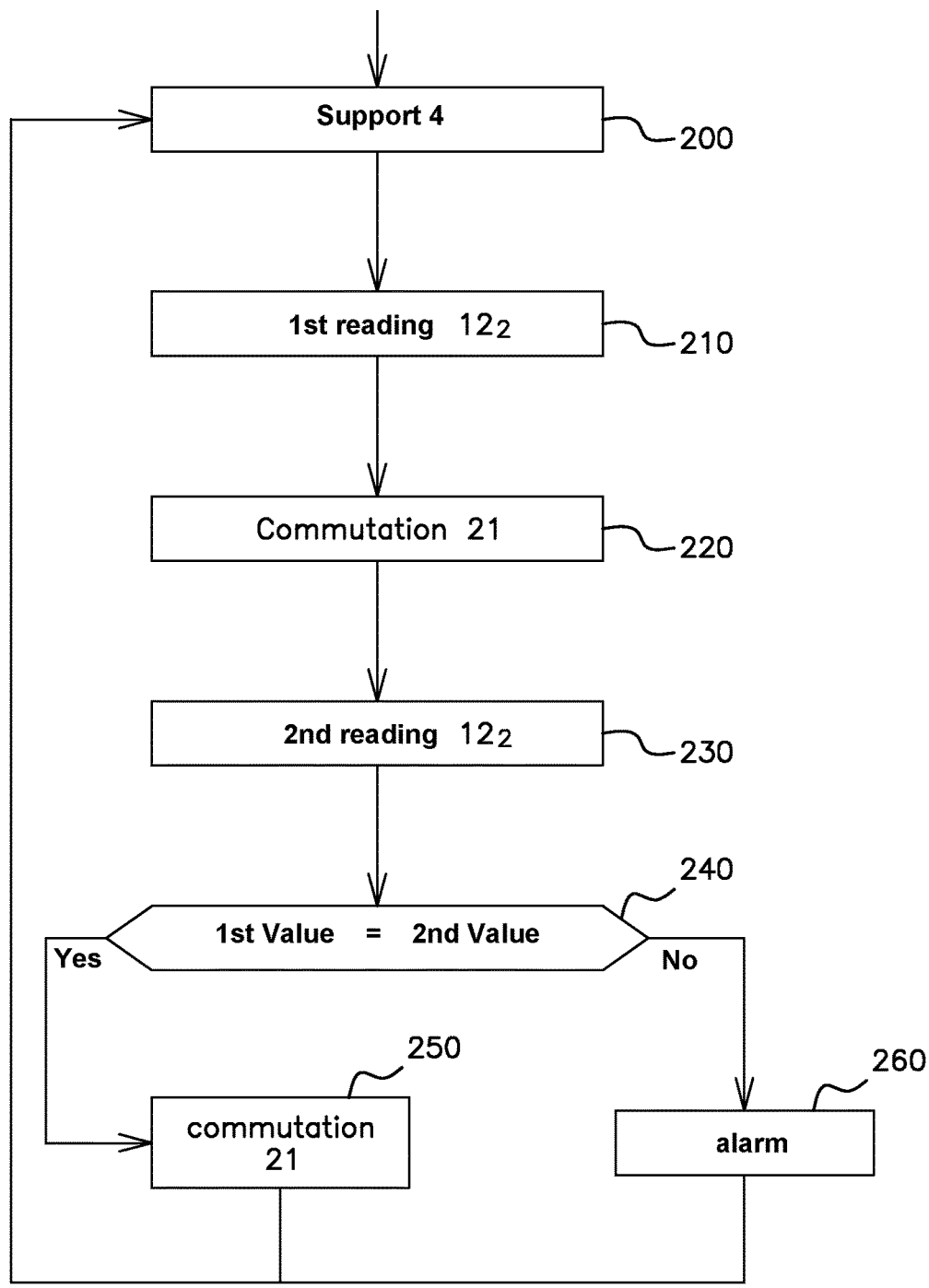
FIG. 3 is a flowchart illustrating the diagnostic method according to the invention.

The operation of the start/stop system 100 is explained hereinafter with reference to FIG. 3.

Before any use of the diagnostic method according to the invention the switch 4 is open, the switch $I_1$ is closed and the ground switch 21 is closed.

The change of the switch 4 to the closed position is detected in a step 200. It is detected by the reading circuit 15 associated with the computer 12, which reads/measures (step 210) a first voltage value close to zero at the reading input $12_2$ of the computer 12.

Note that the voltage value close to zero can be detected at the reading input $12_2$ of the computer either because the driver depresses the switch 4 to indicate an intention to start/stop the vehicle or because a short-circuit to ground CC has appeared on the conductive track 5.

Note also that the voltage value read/measured via the reading input $12_2$ is in fact generally between 0 and 2 volts (because this value is affected by noise). The remainder of the description will refer to a value substantially equal to zero volts.

When the computer 12 has read/measured at the reading input $12_2$ a first value substantially equal to zero, it switches the ground switch 21 to an open position (step 220). This switching is temporary (of the order of 100 μs to a few tens of ms).

During this switching of the ground switch 21 to its open position, the reading input $12_2$ of the computer reads/measures a second voltage value (step 230).

In a step 240, the computer 12 compares the first value read/measured and the second value read/measured.

If the two read/measured values are significantly different then the switch 4 has indeed sent a start/stop instruction and there is no short-circuit to ground on the conductive track 5. In this case the ground switch 21 is switched to its closed position (step 250) and the start/stop system awaits another instruction from the driver.

If (in step 260) the two measured values are substantially equal (ignoring the value of the noise) then an alarm message is sent by the computer to indicate that a short-circuit to ground is present on the conductive track 5. The alarm that is sent can for example indicate that the start/stop device is faulty or specify the exact fault that has been detected so that a competent person can fix said fault. When the alarm message has been sent, the ground switch 21 is switched to its closed position (step 250) and the start/stop system awaits another instruction from the driver.

It will be noted that the method according to the invention of diagnosing a ground fault in a start/stop unit consists in:
in a preliminary phase:
  equipping the driver device (11) with a ground (20) switchable between two positions and connecting the ground output (3) of the start/stop device (10) to said switchable ground (20),
during operation of the vehicle, at the time of a start/stop instruction:
  reading (step 210) a first value of the signal present at the input of the reading circuit (15), then,
  temporarily switching (step 220) the switchable ground (20) from a first position connected to a ground (16) of the vehicle to a second position connected to a ground resistor ($R_M$),
  reading (step 230) a second value of the signal received by the reading circuit (15) during the switching of the ground to the resistor ($R_M$), and
  comparing the first and second values (step 240), and
    if the first and second values read are significantly different, diagnosing an absence of a short-circuit to ground,
    if the first and second values read are substantially equal, diagnosing (step 260) a short-circuit to ground fault of the start/stop unit (4).

The first and second values read are voltage values (in the example described).

The ground switch 21 (switching unit included in the switchable ground 20) is for example a protected electronic transistor.

Note that the time taken to open the ground switch 21 is very short, on the one hand because the measurement of the voltage value via the input 12₂ of the computer takes very little time but also because during this opening process the power supply current of the light-emitting diode (LED) 14 is reduced. Because of this, the brightness of the LED 14 is also slightly reduced. In order not to disturb the driver, it is therefore important that the time taken to open the ground switch 21 is short so that the variation of the luminous intensity is not perceived by the driver. The driver is in fact not able to perceive this reduction of the luminous intensity of the LED because it does not exist at the time they depress the switch 4. This LED is generally lit when the driver enters the vehicle and has the function of indicating to the driver where the motor start/stop switch 4 is located (which can be very useful, especially at night).

In a variant (not shown) a second light-emitting diode can be added to back-light the button, for example.

Note that in general the values of the power supply resistor and ground resistor (respectively $R_A$ and $R_M$) are generally of the order of 1 kΩ. The battery voltage $V_{bat}$ is of the order of 14 V. The reading resistor $R_L$ (of the order of 3 kΩ) and ground resistor $R_M$ constitute a voltage divider bridge, and because of this the values read/measured via the reading input 12₂ are as follows:
  without depressing the switch 4, the value read is $V_{bat}$,
  if the switch 4 is depressed and there is no short-circuit and the ground switch 21 is open, the value read is greater than $V_{bat}/2$ (because of the voltage divider bridge); in this case the value read is in fact equal to:

$$\frac{Vbat * R_M}{R_L + R_M} + I_{LED} * \frac{R_L}{R_M}$$

where $I_{LED}$ is the current flowing in the light-emitting diode 14,
if there is an open circuit, the value read is $V_{bat}$,
if there is a short-circuit to ground (the situation diagnosed by the invention), the value read is substantially equal to 0 V (ignoring the ground offset error and noise),
if the battery is short-circuited, the value read is $V_{bat}$.

The two critical situations to be distinguished are the short-circuit to ground and depressing the switch 4. As indicated above, the values read in these two situations are very different (of the order of $V_{bat}/2$ and 0), which enables them to be distinguished without difficulty.

The method according to the invention is simple to implement and of relatively low cost (addition of a resistor $R_M$ and a switch 21, which may moreover already be present in the computer 12).

The resulting short-circuit diagnosis is fast and reliable, which eliminates all risk of false detection of starting or stopping of the motor of the vehicle.

Note further that the invention can be applied to a start/stop system the switch 4 of which is activated by the battery voltage (and not by the connection to ground as in the example described) and the light-emitting diode 14 of which is controlled by a low side type driver circuit, i.e. one with the switch $I_1$ between the load and ground.

Of course, the values indicated for the resistors and for the voltages read at the input 12₂ of the computer 12 are given by way of illustration only and may vary without departing from the scope of the present invention.

The invention claimed is:

1. A method of diagnosing a ground fault of a start/stop unit (4) adapted to control the starting and the stopping of a vehicle motor, said unit being part of a start/stop device (10) further including a ground output (3), said device (10) being further associated with a driver device (11) including a circuit (15) for reading the status of the start/stop unit, said diagnostic method comprising:
  in a preliminary phase:
    equipping the driver device (11) with a ground (20) switchable between two positions and connecting the ground output (3) of the start/stop device (10) to said switchable ground (20),
  during operation of the vehicle, at the time of a start/stop instruction:
    reading (step 210) a first value of the signal present at the input of the reading circuit (15), then,
    temporarily switching (step 220) the switchable ground (20) from a first position connected to a ground (16) of the vehicle to a second position connected to a ground resistor ($R_M$),
    reading (step 230) a second value of the signal received by the reading circuit (15) during the switching of the ground to the resistor ($R_M$), and
    comparing the first and second values (step 240), and
      if the first and second values read are significantly different, diagnosing an absence of a short-circuit to ground,
      if the first and second values read are substantially equal, diagnosing (step 260) a short-circuit to ground fault of the start/stop unit (4).

2. The diagnostic method as claimed in claim 1 wherein the first and second values read are voltage values.

3. A system (100) for starting/stopping a vehicle motor, including:
   a start/stop device (10) including a unit (4) for starting/stopping the motor of the vehicle and a ground output (3), and
   a driver circuit (11) including:
      a circuit (15) for reading the status of the start/stop unit (4), wherein
   the driver device (11) further includes:
      a switchable ground (20) including a ground switch (21) connected on the one hand to the ground output (3) of the start/stop device (10) and on the other hand to a ground (16) of the vehicle, said ground switch (21) being adapted to switch between a position connected to the ground (16) of the vehicle and a position connected to a ground resistor ($R_M$).

4. The start/stop system (100) as claimed in claim 3, wherein the ground switch (21) is connected in parallel with the ground resistor ($R_M$).

5. The start/stop system (100) as claimed in claim 4, wherein the ground switch (21) is driven by a computer (12) of the driver device (11).

6. The start/stop system (100) as claimed in claim 4, wherein the ground switch (21) is a protected electronic transistor.

7. The start/stop system (100) as claimed in claim 3, wherein a voltage divider bridge is created by the ground resistor $R_M$ and a reading resistor $R_L$ of the reading circuit (15).

8. The start/stop system (100) as claimed in claim 5, wherein the ground switch (21) is a protected electronic transistor.

9. The start/stop system (100) as claimed in claim 4, wherein a voltage divider bridge is created by the ground resistor $R_M$ and a reading resistor $R_L$ of the reading circuit (15).

10. The start/stop system (100) as claimed in claim 5, wherein a voltage divider bridge is created by the ground resistor $R_M$ and a reading resistor $R_L$ of the reading circuit (15).

11. The start/stop system (100) as claimed in claim 6, wherein a voltage divider bridge is created by the ground resistor $R_M$ and a reading resistor $R_L$ of the reading circuit (15).

12. The start/stop system (100) as claimed in claim 8, wherein a voltage divider bridge is created by the ground resistor $R_M$ and a reading resistor $R_L$ of the reading circuit (15).

* * * * *